United States Patent
Nickel

(10) Patent No.: US 9,645,215 B2
(45) Date of Patent: May 9, 2017

(54) DETERMINATION OF A PHASE DIFFERENCE MAP

(71) Applicant: SIEMENS AKTIENGESELLSCHAFT, Munich (DE)

(72) Inventor: Marcel Dominik Nickel, Erlangen (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 715 days.

(21) Appl. No.: 14/102,715

(22) Filed: Dec. 11, 2013

(65) Prior Publication Data

US 2014/0167755 A1 Jun. 19, 2014

(30) Foreign Application Priority Data

Dec. 19, 2012 (DE) .................. 10 2012 223 789

(51) Int. Cl.
G01R 33/48 (2006.01)

(52) U.S. Cl.
CPC ................ *G01R 33/4828* (2013.01)

(58) Field of Classification Search
CPC .................................................. G01R 33/4828
See application file for complete search history.

(56) References Cited

U.S. PATENT DOCUMENTS

| 5,994,902 A | 11/1999 | Li |
| 7,888,936 B2 | 2/2011 | Jellus |
| 2002/0193680 A1* | 12/2002 | Feiweier ............ G01R 33/4828 600/410 |

(Continued)

FOREIGN PATENT DOCUMENTS

| CN | 101172036 A | 5/2008 |
| CN | 101658422 A | 3/2010 |

(Continued)

OTHER PUBLICATIONS

J. Ma: "Two-point Dixon imaging with flex eche times and a region growing-based postprocessing algorithm"; Proc.Intl. Soc. Mag. Reson. Med. pp. 270.; 2011; US.

(Continued)

*Primary Examiner* — Rodney Bonnette
(74) *Attorney, Agent, or Firm* — Harness, Dickey & Pierce, P.L.C.

(57) ABSTRACT

A method is described for determining a phase difference map for generating image data of two different chemical substance types in a defined region of an examination object via magnetic resonance imaging measurement. First and second magnetic resonance raw echo data of the defined region is first captured at two different arbitrary echo times. First and second image data of the defined region is then reconstructed on the basis of the first and second magnetic resonance raw echo data. Candidate phase difference values are finally determined on the basis of the first and second image data for image points of the defined region using a signal model of at least one of the two chemical substance types and the phase difference map is thus created. Also described are an image processing facility and a magnetic resonance unit including the image processing facility.

22 Claims, 4 Drawing Sheets

(56) References Cited

U.S. PATENT DOCUMENTS

| | | | |
|---|---|---|---|
| 2005/0165296 A1* | 7/2005 | Ma | G01R 33/4828 600/410 |
| 2009/0201021 A1 | 8/2009 | Jellus | |
| 2010/0052674 A1 | 3/2010 | Jellus et al. | |
| 2010/0201364 A1 | 8/2010 | Jellus | |
| 2012/0224757 A1 | 9/2012 | Gross | |
| 2012/0249138 A1 | 10/2012 | Pfeuffer | |
| 2012/0268118 A1 | 10/2012 | Fenchel | |

FOREIGN PATENT DOCUMENTS

| | | |
|---|---|---|
| CN | 102697501 A | 10/2012 |
| CN | 102749602 A | 10/2012 |
| EP | 2431760 A1 | 3/2012 |
| EP | 2503350 A1 | 9/2012 |
| WO | WO-2010113048 A1 | 10/2010 |

OTHER PUBLICATIONS

Chinese Office Action and English translation thereof dated Feb. 3, 2016.

Berglund Johan et al.: "Two-point Dixon Method With Flexible Echo Times", in: Magnetic Resonance in Medicine, vol. 65, 2011, pp. 994-1004, DOI: 10.1002/mrm.22679.

Eggers Holger et al.: "Dual-Echo Dixon Imaging with Flexible Choice of Echo Times", in: Magnetic Resonance in Medicine, vol. 65, 2011, pp. 96-107, DOI: 10.1002/mrm.22578.

Ren et al.: "Composition of adipose tissue and marrow fat in humans by $^1$H NMR at 7 Tesla," Jounal of Lipid Rsearch, vol. 49, 2008, p. 2055-2062.

* cited by examiner

DETERMINATION OF A PHASE DIFFERENCE MAP

PRIORITY STATEMENT

The present application hereby claims priority under 35 U.S.C. §119 to German patent application number DE 10 2012 223789.5 filed Dec. 19, 2012, the entire contents of which are hereby incorporated herein by reference.

FIELD

At least one embodiment of the invention generally relates to a method for determining a phase difference map of a defined region of an examination object by way of magnetic resonance imaging measurement, wherein it is then possible to use the phase difference map later to produce a phase correction for generating image data of at least two different chemical substance types, for example fat and water, in the defined region. At least one embodiment of the invention also generally relates to an image processing facility for determining a phase difference map and optionally for generating image data of two different chemical substances in a defined region of the examination object as well as a magnetic resonance unit with such an image processing facility.

BACKGROUND

In order to obtain magnetic resonance-based recordings, in other words image data generated using a magnetic resonance tomography system, from a region inside the body of an examination object, the body or the part of the body to be examined must first be exposed to the most homogeneous static basic magnetic field possible, generally referred to as a B0 field. This aligns the nuclear spins in the body parallel to the direction of the B0 field (generally referred to as the z direction).

Also suitable high-frequency antennas are used to radiate high-frequency pulses (HF pulses) into the examination object, their frequency being in the region of the resonant frequency, the so-called Larmor frequency, of the nuclei to be excited in the magnetic field present. These high-frequency pulses are used to excite the spins of the nuclei to be excited, generally hydrogen nuclei, in the examination object in such a manner that they are deflected through a so-called excitation flip angle from their equilibrium position parallel to the basic magnetic field B0. The nuclear spins precess first around the z direction and then gradually relax, relaxation being a function of the molecular environment, in which the excited nucleus is located. The magnetic resonance signals generated during relaxation are picked up as so-called raw data by means of high-frequency receive antennas and the magnetic resonance images are ultimately reconstructed on the basis of the acquired raw data. Spatial encoding takes place with the aid of rapidly switching gradient magnetic fields, which are superimposed on the basic magnetic field during the emission of the high-frequency magnetic resonance pulses and/or the acquisition of the raw data.

A generally known fundamental problem with the acquisition of the raw data is that the excited nuclei in the body tissue do not have a uniform resonant frequency in the magnetic field but can differ according to their chemical environment for different tissue or substance types. This is generally referred to as chemical displacement. A substance type (or substance for short) refers in the following in the context of the invention to any type of predefined chemical substance or any type of atom or molecule nucleus with certain magnetic resonance behaviors. The substance types fat and water are a typical example of different substance types. A substance type here can contain a number of components which have (slightly) different resonant frequencies, for example when the substance type, as described in more detail below, can be described by a chemical spectral model with a number of peaks in respect of resonant frequency. The different substance types therefore also refer to more complex chemical compounds or mixtures, the different components of which in some instances have different resonant frequencies but make up a characteristic spectrum. Of particular relevance in magnetic resonance imaging is the chemical displacement of fat tissue in relation to the normally excited water, as in many body regions fat is present in considerable quantities. The chemical displacement between fat tissue and water is approx. 3.4 ppm.

In the meantime there are various methods for creating separate magnetic resonance images for different substance types, for example for generating separate water and fat images. One typical method for this is the so-called two-point Dixon method. For this suitable magnetic resonance sequences are used to record raw data by means of two different echoes, for example two different gradient echoes or spin echoes, said echoes differing in their echo time, so that for one echo the phasing of the water corresponds to the phasing of the fat, while for the second echo the phasing of the water is aligned counter to the phasing of the fat. This is possible if the echo times are determined exactly beforehand and the magnetic resonance sequences are structured accordingly. After signal processing and standard Fourier transformation for reconstructing image data from the raw data, two different types of magnetic resonance image data result, specifically image data with corresponding phasing, the so-called in-phase image, and image data with counter phasing, the so-called opposed-phase image. The signal values in both images can be written as follows ignoring the tissue relaxation:

$$S_0(v)=(W(v)+F(v))e^{i\phi_0} \quad (1)$$

$$S_1(v)=(W(v)-F(v))e^{i(\phi_0-\phi)} \quad (2)$$

In these equations the water portion and fat portion are represented in a given image point by $W(v)$ or, as the case may be, $F(v)$. $S_0(v)$ and $S_1(v)$ are the intensity values in the in-phase image and in the opposed-phase image at the respective image point. An image point here and in the following refers in the case of two-dimensional image data to a pixel and in the case of three-dimensional image data to a voxel. $v$ here represents the coordinates of the image point (i.e. $v=(x,y,z)$, when x, y and z respectively are the coordinates along the x axis, y axis and z axis). The unit in which the spatial coordinates are given can be defined for example simply by the number of image points in the respective direction. The value $\phi_0$ gives the phase in the image that results due to field inhomogeneities and a static phase error that can occur in the signal and receive chain. The phase rotation or phase $\phi$ represents a further phase error mainly due to the field inhomogeneity that results between the in-phase and opposed-phase echo. In between are various algorithms for generating the water image W and fat image F from the in-phase image and opposed-phase image using the equations (1) and (2). Because of possible field inhomogeneities, gradient delays, eddy currents, etc. it is very important for the two-point Dixon method to determine the overall phase rotation $\phi$ between the two echo times per image point and then take it into account in the reconstruction. Generally it is assumed for this purpose that the phase rotation variation is spatially weak, in other words the variation between adjacent image points is for example <180°.

One major disadvantage of this two-point Dixon method is the restriction to quite precisely defined echo times. This significantly reduces freedoms when developing appropriate magnetic resonance sequences. It is then no longer possible to match the echo times to other conditions, in order for example to develop a particularly fast magnetic resonance sequence in order to achieve an optimum signal to noise ratio, etc.

In the article by Holger Eggers et al. "Dual-Echo Dixon Imaging with Flexible Choice of Echo Times" in Magnetic Resonance in Medicine 65, pages 96 to 107, 2011, a method is described, in which the echo times can be selected in a more flexible manner. However as before a relatively simple model is used for fat, in which it is assumed that fat has precisely one resonant frequency line. In fact however fat, like many other substance types, has a plurality of resonant frequencies very close together, in other words should really be described by a multi-peak spectral model. In EP 2 431 760 A1 therefore Eggers describes a method, in which such a multi-peak spectral model can be used for fat, with the result however that the overall mathematical description becomes much more complicated compared with the known conventional method. In order ultimately to arrive at a water image or fat image, it is therefore proposed in EP 2 431 760 A1 that first all the voxels for which there is a unique mathematical solution should be identified and then the non-uniqueness should be resolved for the other voxels. The voxels with unique solutions identified in the direct vicinity are then used. In order to achieve this, a correspondingly large number of voxels in which such a mathematically unique solution exists is required in the images. To this end it is demonstrated that it is possible to influence the number of voxels with unique solutions by selecting the echo times appropriately. This has the disadvantage that although the echo times are not set exactly—unlike with the conventional method—there is still a not inconsiderable restriction in respect of the selection of echo times.

SUMMARY

At least one embodiment of the present invention is directed to a method and/or a suitable image processing facility for determining a phase difference map for the (immediate or later) generation of image data of two different chemical substance types, which still allows a selection of echo times in an even more extended range, preferably almost any selectable echo times, while remaining as precise as possible.

On the one hand, a method is disclosed and on the other hand, an image processing facility is disclosed.

A method, of an embodiment for determining the phase difference map, comprises:

First and second magnetic resonance raw echo data (hereafter referred to as "echo data" for short) of the desired defined region is first captured, being recorded at two different arbitrary echo times. The capturing of the echo data here can be understood directly as the acquisition of the echo data using the magnetic resonance unit. However in principle said echo data can also have been acquired beforehand and is now transferred by the image processing facility for example by way of a suitable interface.

First and second image data is then reconstructed from the echo data in the usual manner. This is similar to the in-phase and opposed-phase images mentioned in the introduction but now, as the echo times can be freely selected, the signals of the two substance types are not necessarily in phase in the one set of image data and do not necessarily have an opposed phase in the other set of image data; it is simply sufficient for there to be different phases.

Also as part of the method, candidate phase difference values are determined based on the first and second image data for image points of the defined region using a spectral signal model of at least of one of the two chemical substance types. According to an embodiment of the invention this signal model contains at least one settable echo time parameter, i.e. the parameter can be input once as a form variable at the start of the method or can be transferred by way of an interface in the signal model, an echo time parameter representing an echo time during which the echo data was acquired.

At least one embodiment of an inventive image processing facility for determining a phase difference map and optionally for generating image data of two different chemical substance types of a defined region of an examination object requires inter alia the following components:

On the one hand an interface is required for capturing first and second MR echo data of the defined region for two different echo times.

The image processing facility should also have an image data reconstruction unit, which is configured to reconstruct first and second image data of the defined region on the basis of the first and second MR echo data.

The essential components of the image processing facility can predominantly be configured in the form of software components. This applies in particular to the image data reconstruction unit, the phase difference determination unit and the optional image determination unit. In principle however some of these components can be implemented in the form of software-assisted hardware, for example FPGAs or the like, in particular when particularly fast calculations are required. Similarly the required interfaces can be configured as software interfaces, for example when it is simply a matter of transferring data from other software components. They can however also be configured as interfaces constructed from hardware, which are activated by suitable software.

As mentioned above such an image processing facility can be connected independently as an image processor to a suitable network, for example a radiological information system (RIS), to which the magnetic resonance unit is also connected, to supply the necessary data from there to the image processing facility. In principle however the image processing facility can also be implemented within a control facility of the magnetic resonance unit, allowing a plurality of the components that are in any case available there also to be used.

BRIEF DESCRIPTION OF THE DRAWINGS

The invention is described again in more detail below with reference to the accompanying figures based on example embodiments. In the drawing.

DETAILED DESCRIPTION OF THE EXAMPLE EMBODIMENTS

Figure 1:
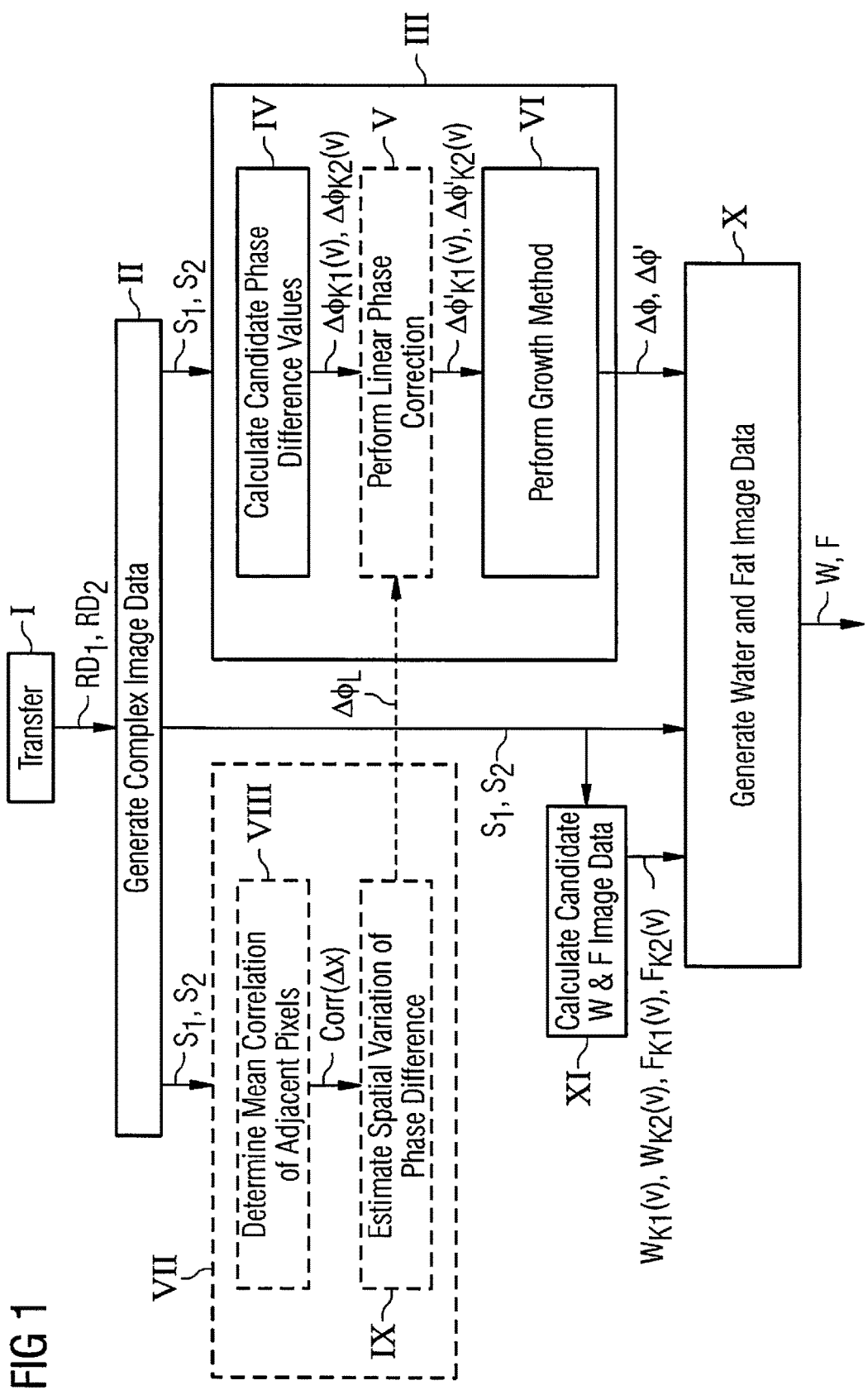
FIG. 1 shows a flow diagram of a sequence of an example embodiment of an inventive method for determining a phase difference map and generating separate image data for two chemical substances.

The present invention will be further described in detail in conjunction with the accompanying drawings and embodiments. It should be understood that the particular embodiments described herein are only used to illustrate the present invention but not to limit the present invention.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

Specific structural and functional details disclosed herein are merely representative for purposes of describing example embodiments of the present invention. This invention may, however, be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

A method, of an embodiment for determining the phase difference map, comprises:

First and second magnetic resonance raw echo data (hereafter referred to as "echo data" for short) of the desired defined region is first captured, being recorded at two different arbitrary echo times. The capturing of the echo data here can be understood directly as the acquisition of the echo data using the magnetic resonance unit. However in principle said echo data can also have been acquired beforehand and is now transferred by the image processing facility for example by way of a suitable interface.

First and second image data is then reconstructed from the echo data in the usual manner. This is similar to the in-phase and opposed-phase images mentioned in the introduction but now, as the echo times can be freely selected, the signals of the two substance types are not necessarily in phase in the one set of image data and do not necessarily have an opposed phase in the other set of image data; it is simply sufficient for there to be different phases.

Also as part of the method, candidate phase difference values are determined based on the first and second image data for image points of the defined region using a spectral signal model of at least of one of the two chemical substance types. According to an embodiment of the invention this signal model contains at least one settable echo time parameter, i.e. the parameter can be input once as a form variable at the start of the method or can be transferred by way of an interface in the signal model, an echo time parameter representing an echo time during which the echo data was acquired.

The candidate phase difference values here are the possible solutions for the phase difference, which should be present at the respective image point. Candidate phase difference values are generated here for all the image points of the defined region where possible. In principle it is possible at a certain image point either to determine two such candidate phase difference values based on the first and second image data or to find a unique solution (i.e. just one defined phase difference value) or not to find any mathematical solution. In this instance no candidate phase difference value can be determined at the respective image point. Whether just one or no exact solution can be present is a function of the magnitude of the quotient of the signals $S_1(v)/S_2(v)$. Generally there are very few image points however. With most image points the situation is such that two possible candidate phase difference values can be found.

Both a simpler model, as described in the publication mentioned in the introduction "Dual-Echo Dixon Imaging with Flexible Choice of Echo Times" by H. Eggers et al., and a complicated spectral model, as described for example in EP 2 431 760 A1, can be used as the signal model, the entire contents of each of which are hereby incorporated herein by reference. In principle any model can be used. It is only important that it accordingly contains at least one, preferably at least two, settable echo time parameters, to allow matching to the echo times (freely) set during the acquisition of the echo data.

The phase difference map is then also created, with a phase difference value first being determined at least for one seed point, optionally also a number of seed points. This generally takes place on the basis of the candidate phase difference values, with one of these two candidate phase difference values being selected, unless the seed point is randomly one at which the phase difference value is unique anyway.

According to at least one embodiment of the invention, a phase difference value is selected in each instance from the candidate phase difference values of the respective image point starting from the seed point in an image point by image point progressive growth method for the individual image points. If just one candidate phase difference value is present for an image point, said candidate phase difference value should be seen as a unique solution. Of course no selection then has to take place or the transfer of the candidate phase difference value as the determined phase difference can be defined as a selection. In the context of the present invention a progressive growth method refers to a method in which progress is made from a seed point to a next adjacent image point, in other words an image point which is directly adjacent to the previously considered image point (e.g. the seed point in the first step). In further method steps movement then takes place from this adjacent point to a next but one neighbor, from there to the next but next but one neighbor and so on, as with a region growth method.

It should be mentioned specifically in this context that the determination of the candidate phase difference values for the individual image points and the creation of the phase difference map can operate in a parallel manner within the context of the image point by image point progressive growth method, in other words that candidate phase difference values for an image point can always be determined whenever they are required for said image point in the context of the image point by image point progressive growth method. In principle however it is also possible to create the candidate phase difference values first for all the image points and to create for example two candidate phase difference maps, in which candidate phase difference values are shown in each instance and only later to select the "correct" candidate phase difference values.

At least one embodiment of the inventive method therefore makes it possible in a simple manner, even with an arbitrary, very complicated signal model and with arbitrary echo times, to generate a phase difference map, on the basis of which the different separate image data of the two chemical substance types, for example a water image and a fat image, can later be generated. The fact that an arbitrary signal model can be used makes the method very accurate, as it means that a signal model can be used, which allows the best possible matching to actual conditions, for example a multi-peak signal model. On the other hand the inventive procedure for creating the phase difference map with the aid of an image point by image point progressive growth method means that it is no longer necessary to achieve a plurality of image points, in which a mathematically unique solution is present. In principle this method can even operate when there is no mathematically unique solution for any single image point. Therefore with regard to the application of the inventive Dixon method there are no longer any restrictions in respect of the selection of echo times, so that when designing the magnetic resonance sequences the echo times can be optimized in respect of other aspects, for example the highest possible sequence speed or the best possible signal to noise ratio of the signals obtained.

As mentioned, at least one embodiment of the inventive method can advantageously be used to determine separate image data for the two different chemical substance types in a defined region of the examination object. To this end the image data for the chemical substance types, i.e. the intensity values for the respective images of the substance types, is determined in each instance on the basis of the first and second image data, i.e. the intensity values reconstructed from the first and second magnetic resonance raw echo data for the individual image points of the defined region, and on the basis of the phase difference map.

At least one embodiment of an inventive image processing facility for determining a phase difference map and optionally for generating image data of two different chemical substance types of a defined region of an examination object requires inter alia the following components:

On the one hand an interface is required for capturing first and second MR echo data of the defined region for two different echo times.

The image processing facility should also have an image data reconstruction unit, which is configured to reconstruct first and second image data of the defined region on the basis of the first and second MR echo data.

According to at least one embodiment of the invention a phase difference determination unit is also required, which is configured to determine candidate phase difference values on the basis of the first and second image data for image points of the defined region using a signal model of at least one of the two chemical substance types, the signal model containing at least one settable echo time parameter, and to create a phase difference map, with a phase difference value first being determined for at least one seed point and a phase difference value being selected in each instance from the candidate phase difference values of the respective image point starting from the seed point in an image point by image point progressive growth method for the individual image points.

If the image processing facility is also to be suitable for generating separate image data for two different chemical substances on the basis of the phase difference map, it (optionally) also has an image determination unit, which is configured to determine the image data for the chemical substance types on the basis of the phase difference map and on the basis of the first and second image data of the defined region.

The image processing facility also generally has suitable output interfaces, for example to transfer the created phase difference map to another unit, which can then generate the image data of the different chemical substance types or, if the image processing facility itself generates the image data of the two different chemical substance types, a corresponding output interface for the generated image data, so that this can then be stored and/or output to an operator and/or sent by way of a network to other points optionally for further processing and/or outputting.

In addition to a basic field magnet system, with which a basic field magnet is applied in the usual manner in the patient measuring chamber, a transmit antenna system, with which the high-frequency signals are emitted, a gradient system with a number of gradient coils, a high-frequency receive antenna system and a corresponding control facility, which controls all the components, an inventive magnetic resonance unit must also have an image processing facility as described above. In principle such a magnetic resonance unit can of course also have a plurality of further components (not described in detail), which are known to the person skilled in the art.

The essential components of the image processing facility can predominantly be configured in the form of software components. This applies in particular to the image data reconstruction unit, the phase difference determination unit and the optional image determination unit. In principle however some of these components can be implemented in the form of software-assisted hardware, for example FPGAs or the like, in particular when particularly fast calculations are required. Similarly the required interfaces can be configured as software interfaces, for example when it is simply a matter of transferring data from other software components. They can however also be configured as interfaces constructed from hardware, which are activated by suitable software.

As mentioned above such an image processing facility can be connected independently as an image processor to a suitable network, for example a radiological information system (RIS), to which the magnetic resonance unit is also connected, to supply the necessary data from there to the image processing facility. In principle however the image processing facility can also be implemented within a control facility of the magnetic resonance unit, allowing a plurality of the components that are in any case available there also to be used.

A largely software-based implementation has the advantage that image processing facilities and magnetic resonance unit control facilities used to date can also be retrofitted in a simple manner by means of a software update in order to operate in the inventive manner. To this extent the object is also achieved by a computer program product, which is stored in a transportable storage unit and/or is supplied by way of a network for transmission and can thus be loaded directly into a storage unit of a programmable image processing facility, with program segments for executing all the steps of the inventive method, when the program is executed in the image processing facility.

The dependent claims and the description which follows each contain particularly advantageous embodiments and developments of the invention. The claims of one claim category here can in particular be developed in the same manner as the dependent claims of another claim category. Also the different features of different example embodiments and claims can be combined to form new example embodiments within the context of the invention.

In so far as an arbitrary spectral model is to be used as the signal model, as specified for at least one embodiment of the invention, the equations (1) and (2) set out above cannot be used for the pure generation of image data, which is first in-phase and then in a counter phase. More complicated complex-value equations then have to be used to describe the signals correctly. For example the complex-value signals $S1(v)$ and $S2(v)$ at an image point with the coordinates v can be described by the equation $$S_1(v) = (W(v) + c_1 F(v))e^{i\phi_1(v)} \quad (3)$$

$$S_2(v) = (W(v) + c_2 F(v))e^{i\phi_2(v)} \quad (4)$$

Here $W(v)$ again denotes the water portion and $F(v)$ the fat portion at the respective image point. In principle however $W(v)$ and $F(v)$ can also denote any other chemical substance types. The conventional notation for water and fat is only used for simplicity as this is the most common instance of use. In the equations (3) and (4) $c_1$ and $c_2$ are complex-value coefficients, which are a function of the echo time and the spectrum of the second chemical substance (i.e. here by way of example the spectrum of fat F). In the equations (3) and (4) it is also assumed for the sake of simplicity that a complicated spectrum is only present for one of the two chemical substance types, in this instance fat F. In principle however this method can also be extended to other substance types, in which case a complex-value coefficient would also have to be inserted before the W component in the equations (3) and (4). It is also assumed in the equations (3) and (4) that the phases or phase rotations of the signals are given respectively by $\phi_1(v)$ and $\phi_2(v)$.

The complex coefficients $c_1$ and $c_2$ here are preferably given by the equations $$c_1 = \sum_m w_m e^{i\Theta_{m,1}} \quad (5)$$

$$c_2 = \sum_m w_m e^{i\Theta_{m,2}}. \quad (6)$$

Here m is the number of peaks in each instance, as used in the spectral model for the second chemical substance. The coefficients wm are weighted in such a manner that the sum of wm over all m is equal to 1. Also $\Theta_{m,1} = 2\Pi \cdot \Delta f_m \cdot TE_1$ and $\Theta_{m,2} = 2\Pi \cdot \Delta f_m \cdot TE_2$ are the echo time-dependent dephasings, where $\Delta f_m$ (e.g. in s−1) in each instance is the offset in the resonant frequency for the mth peak of the spectrum of the second chemical substance, in other words fat here, in relation to the water peak and $TE_1$ and $TE_2$ are the (freely selectable) echo times of the first and second echo (in each instance in ms for example). A multipeak spectral model is thus preferably used as the signal model for at least one of the two substances. If the echo times and the spectrum are known, the equations (5) and (6) can be used to calculate the two coefficients $c_1$, $c_2$ for the respective specific instance, which can then be used in the equations (3) and (4). Suitable models, from which the number of peaks, the offset frequencies $\Delta f_m$ and the appropriate weighting factors $w_m$ can be taken, are known from the literature and are described for example in Ren J. et al., Journal of Lipid Research 2008; 49:2055-2062. For further details of the underlying theory, reference can also be made to EP 2 431 760 A1.

As mentioned above however at least one embodiment of the inventive method is not restricted to a multipeak spectral model. Thus in a simpler variant a model with just one peak could also be used. For the mathematical description in the equations (5) and (6) m=1 and therefore also $w_m=1$ could be used, so the equations are simplified as follows:

$$c_1 = e^{i\Theta_1} \quad (5')$$

$$c_2 = e^{i\Theta_2} \quad (6')$$

Here $\Theta_1 = 2\Pi \cdot \Delta f \cdot TE_1$ and $\Theta_2 = 2\Pi \cdot \Delta f \cdot TE_2$ are again correspondingly the dephasings or phase rotations that are a function of the echo times, with $\Delta f$ here being the offset in the resonant frequency for the single peak of the spectrum of the second chemical substance, in other words in this instance fat, in relation to the water peak and $TE_1$ and $TE_2$ again being the (freely selectable) echo times of the first and second echo.

The hitherto known phase correction mentioned in the introduction on the basis of in-phase and opposed-phase images is based on the model assumption that the appropriate selection of the echo times means that the water and fat have magnetizations which are either parallel or antiparallel. This means that in particular the phase of the parallel instance can be used to calculate a phase difference per pixel. This phase difference can then be used to perform the phase correction. In the case of arbitrary echo times and/or a complicated spectral model for arbitrary chemical substance types this assumption is no longer automatically justified and the calculation becomes much more complicated. This is because for example—as set out above—instead of the equations (1) and (2) mentioned in the introduction, the complex-value equations (3) and (4) now have to be created to describe the situation appropriately. The aim here is to determine the parameters $\phi_1(v)$ and $\phi_2(v)$ as well as $W(v)$ and $F(v)$ of the equations (3) and (4) from the measured complex-value data $S_1(v)$ and $S_2(v)$. For this the magnitudes $$|S_1(v)| = |W(v) + c_1 F(v)| \quad (7)$$

$$|S_2(v)| = |W(v) + c_2 F(v)| \quad (8)$$

of the measured data $S_1(v)$ and $S_2(v)$ can first be considered. This equation system has up to two solutions $\{W_{K1}(v), F_{K1}(v)\}$ and $\{W_{K2}(v), F_{K2}(v)\}$ with a positive real-value portion of (for example) fat, given by $$F_{K1} = \sqrt{\frac{-a_2 + \sqrt{-a_2^2 - 4a_1 a_3}}{2a_1}} \quad (9)$$

$$F_{K2} = \sqrt{\frac{-a_2 - \sqrt{-a_2^2 - 4a_1 a_3}}{2a_1}} \quad (10)$$

$$W_{K1} = \frac{|S_1|^2 - |S_2|^2 - (|c_1|^2 - |c_2|^2) F_{K1}^2}{2\Re(c_1 - c_2) F_{K1}} \quad (11)$$

$$W_{K2} = \frac{|S_1|^2 - |S_2|^2 - (|c_1|^2 - |c_2|^2) F_{K2}^2}{2\Re(c_1 - c_2) F_{K2}} \quad (12)$$

Here $$a_1 = (\Re(c_1)^2 - \Im(c_1)^2 - 2\Re(c_1)\Re(c_2) + |c_2|^2)^2 + 4(\Re(c_1 - c_2))^2 \Im(c_1)^2 \quad (13)$$

$$a_2 = 2(\Re(c_1)^2 - \Im(c_1)^2 - 2\Re(c_1)\Re(c_2) + |c_2|^2)(|S_1|^2 - |S_2|^2) - 4(\Re(c_1 - c_2))^2 |S_1|^2 \quad (14)$$

$$a_3 = (|S_1|^2 - |S_2|^2)^2 \quad (15)$$

In the equations (11) to (14) $\Re$ denotes the real part and $\Im$ the imaginary part. These equations also give maximum two possible solutions again for the phase differences that first have to be determined correctly in the context of the present invention, mainly for each image point $$e^{i(\varphi_2(v) - \varphi_1(v))}\Big|_{\text{first solution}} = \frac{S_1(v)^* S_2(v)}{(W_{K1}(v) + c_1^* F_{K1}(v))(W_{K1}(v) + c_2 F_{K1}(v))} \quad (16)$$

$$e^{i(\varphi_2(v) - \varphi_1(v))}\Big|_{\text{second solution}} = \frac{S_1(v)^* S_2(v)}{(W_{K2}(v) + c_1^* F_{K2}(v))(W_{K2}(v) + c_2 F_{K2}(v))} \quad (17)$$

Here the upper index * symbolizes the conjugated value. The equations (16) and (17) therefore supply the cited candidate phase difference values. The equations (9) to (12) supply candidate image data of the chemical substance types matching the candidate phase difference values, in other words the above equations are also used at the same time to determine the possible solutions for the water image and the fat image for each image point which would result in the respective image point for the two candidate phase difference values. When it is uniquely determined which of the two solutions (16) or (17) correctly describes the phase difference at an image point, it can also then be determined which of the two solutions $\{W_{K1}(v), F_{K1}(v)\}$, $\{W_{K2}(v), F_{K2}(v)\}$ according to the equations (9) to (12) is correct. In order to find the correct one of the two solutions (16) or (17), i.e. the correct candidate phase difference value, the image point by image point progressive growth method is used in the context of the invention, as mentioned above.

It can still be assumed, even with the mathematically more complex description of the signals $S_1(v)$ and $S_2(v)$, for example based on the equations (3) to (6), within the progressive growth method that the phase difference only varies to a small degree locally as a function of location. To improve the result, in particular to increase the stability of the image point by image point progressive growth method and also to correct measurement-related artifacts, a linear portion of the spatial variation of the phase difference values of the image points of a subregion are preferably determined or estimated for at least said subregion of the defined region. The determined candidate phase difference values can then be corrected in respect of said estimated linear portion to create the phase difference values. An estimation here means that at least a good approximation of the linear portion of the phase difference is determined.

As set out in detail below, it is preferable for determining the linear portion of the spatial variation of the phase difference values to determine a correlation of the first and second image data for at least one spatial direction, in other words the intensity values of adjacent image points contained in said image data per pixel within the relevant subregion. The determination of the linear portion of the spatial variation particularly preferably takes place over the entire defined region and quite particularly preferably in all three spatial directions.

The correlation can be used for example to capture the mean increase in the phase difference values of the individual pixels in the respective spatial direction over the relevant subregion. This increase can then be used to determine at least a good approximation of the linear portion for each pixel, which is deducted from the respective candidate phase difference value. The modified candidate phase difference values thus obtained for the individual image points within the relevant subregion then generally have fewer spatial variations than without this correction, so that the subsequent image point by image point progressive growth method operates in a more stable manner. A correction of unwanted measuring effects such as eddy currents and temporal gradient delays also takes place at the same time. This is based on the assumption that the linear portion of the phase difference, which is a result of eddy currents and temporal gradient delays, ideally disappears.

When determining the correlation for determining the linear portion it is also possible to take into account a weighting coefficient that is a function of the image point. This weighting coefficient can preferably be a function of an intensity level of the first and/or second image data at the respective image points. The influence of the intensity on the correlation values can then be modified. Additionally or alternatively it is also possible for the weighting coefficient to be a function of the position of the respective image point. This allows masking for example, so that during the correlation only certain image points, for example only image points within a precisely defined region in an area around the currently considered point and/or only points that are adjacent in a certain direction, are taken into account.

Within the image point by image point progressive growth method the correct phase difference values should be determined in each instance on the basis of the candidate phase difference values of an image point, as a function of an adjacent image point, for which a phase difference value has already been determined. In contrast to the method by Eggers et al. mentioned in the introduction, this method therefore does not depend on there being the highest possible number of image points with exact solutions but an adjacent value is simply always used, for which it is assumed that it is in turn correct due to it being adjacent to a previous adjacent value, the phase difference of which has been determined. Ultimately it is assumed here therefore that it is possible to develop a chain of "correct" phase difference values over adjacent pixels based on the original seed image point.

It is still desirable in this method to take into account the quality with which the phase difference values for certain image points were determined, in other words the certainty or probability with which the selected "correct" phase difference value was actually determined correctly. It is therefore particularly preferable for a quality value to be determined according to predefined quality criteria within the growth method in each instance for adjacent image points of an initial image point, for which a phase difference value has already been determined. This initial image point is for example the seed point in the first method step or in further steps the first adjacent point of the seed point, for which a candidate phase difference value has already been formed as the actually present correct phase difference value, etc.

An image point can then be prioritized on the basis of its quality value in order to determine a phase difference value. This is possible for example in that a type of priority list or queue is created, in which the image points are organized in order as a function of their quality value. Instead of or within such a priority list it is also possible to form priority stacks, in other words the image points are organized into a certain stack in each instance as a function of their quality value, for example whether it is between two defined limit values or are organized in a priority list having been grouped accordingly with other image points, the quality values of which are in the same range.

There are diverse ways of determining the quality criteria. In one preferred variant the quality criteria comprise an evaluation of intensity values of the image point in the first and second image data $S_1(v)$, $S_2(v)$. For example a weighting coefficient $g(v)$ can be determined as a function of $S_1(v)$ and $S_2(v)$ according to $$g(v) = \frac{|S_1(v) \cdot S_2(v)|}{\sqrt{(|S_1(v)|^2 + |S_2(v)|^2)/2}} \qquad (18)$$

for this purpose. With a weighting coefficient $g(v)$ according to this equation (18) weighting takes place on the one hand in proportion to the intensity in the given voxel and on the other hand voxels which are either very water-dominated or very fat-dominated are weighted to a greater degree. The latter is because this is the only way of maximizing the magnitudes of $S_1(v)$ and $S_2(v)$ at the same time.

Additionally or alternatively a quality criterion can also involve taking into account whether a unique phase difference value has been determined on the basis of the first and second image data for the relevant image point, in other words for example whether there is a unique solution for the equation.

A further, similarly alternatively or additionally preferred quality criterion includes an evaluation of a deviation of at least one of the candidate phase difference values of the respective image point in respect of a local reference phase difference value. The next candidate phase difference value is preferably used here, in other words the candidate phase difference value of the image point which has the shortest distance from the reference phase difference value. This local reference phase difference value can be for example the correctly selected phase difference value of the current initial image point, from which the neighbors are currently considered. It is assumed here that the quality with which a phase difference value can be determined for a defined image point improves, the smaller its difference is compared to the adjacent point, in other words the more accurately the assumption is met that the phase difference values only vary to a small degree locally.

Alternatively other reference phase difference values can also be used. In one preferred variant of the method the local reference phase difference value comprises a mean phase difference value of the phase difference values of image points of a local area or vicinity of the image point to be evaluated in each instance (in other words of the image point, for which the quality value is currently being determined), for which a "correct" phase difference value has already been determined. This reduces the probability that the method can be influenced negatively by an extreme value at a single image point. In particular in conjunction with the abovementioned prioritization of the image points for determining the phase difference values on the basis of the quality value, this has the advantage that the image points, the phase difference values of which can be determined with a greater certainty, have an even greater influence on the selection of the "correct" phase difference values for the further image points. The "vicinity" or "area" for determining the local reference phase difference value here can be determined arbitrarily. For example only the directly adjacent image points in each spatial direction can be considered, preferably including, but optionally also excluding, the diagonal neighbors. Similarly the area can also be extended to the next but one neighbor or beyond, as long as a locality criterion is still met. Therefore for example only adjacent image points, which are maximum 2 image points away in each direction.

It is quite particularly preferable for the phase difference values of the image points to be weighted in each instance with a weighting factor to determine the mean phase difference value, said weighting factor being able to be a function of the intensity values of the image points in the first and second image data. Equation (18) can also be used here. This has the advantage that image points, at which the intensity is particularly strong and at which therefore it is also probable that the phase difference value can be correctly determined, are weighted to a greater degree. This also readily allows a combination of the different quality criteria.

A phase difference value is then preferably determined in each instance for a new image point, when a quality value has been determined for all the image points in a defined vicinity of a previous image point, in other words of an image point, for which the phase difference value was determined exactly immediately before. The "vicinity" can again be determined arbitrarily. For example only the immediately adjacent image points in each spatial direction can be considered, in other words for example in a two-dimensional image the four image points on both sides in the two spatial directions or in a three-dimensional image volume the immediately adjacent six voxels in all spatial directions but not the diagonally adjacent. Similarly however a vicinity can be selected, in which the diagonally adjacent image points are also included, in other words for example in the case of a 2D method eight adjacent points and in the case of 3D methods 26. Extension to the next but one neighbors, etc. would also be possible here. This vicinity can but does not have to correspond to the definition of the vicinity for calculating the mean phase difference value when determining the quality values, as defined above.

When all the image points in the predefined vicinity have been determined for one image point, a next image point is then used according to the priority determined on the basis of the quality values and a phase difference value is determined for this, for example using the candidate phase difference value, which is nearest to the phase difference value of the adjacent point or which is nearest to the mean phase difference value in the respective area of all the phase difference values of the already determined image points (a "determined image point" in the following refers to an image point, the phase difference value of which has already been determined as "correct" within the method).

The method is then finally terminated when a phase difference value has been determined for all the image points, as far as this is possible. If no candidate phase difference values were available for selection for an image point, the phase difference value can be interpolated later for example, in order to obtain a complete phase difference map, in which the phase difference values are input for all the image points. An approximation can also be stored, either the nearest solution in respect of the magnitude of the quotient of the signals $S_1(v)/S_2(v)$ or by setting all the negative roots in the above solution equations (9) to (12) to zero.

The phase difference map is preferably finally smoothed, for example by low pass filtering. The phase difference values at the individual points can again be replaced by mean values from a defined area for this purpose.

If, as mentioned above, an estimation of the linear portion of the phase difference value has been performed first and deducted accordingly from the candidate phase difference values, the linear phase portion can be added again beforehand first, in other words before the determination of the phase difference map and/or before filtering.

Multiplying $S_1(v)$ from the above equation (3) by the correct solution obtained for the phase difference $e^{i(\phi_2(v)-\phi_1(v))}$ (according to the equations (16) and (17)) and simple redefinition of the equation (4) give the equations $$\tilde{S}_1(v)=(W(v)+c_1F(v))e^{i\phi_2(v)} \qquad (19)$$

$$\tilde{S}_2(v)=(W(v)+c_2F(v))e^{i\phi_2(v)} \qquad (20)$$

In this equation system (7), (8) there is no longer the unwanted phase difference or two phases $\phi_1$ and $\phi_2$ but just one phase $\phi_2$. It is therefore possible in a next step to calculate the desired water image $W(v)$ and fat image $F(v)$. For the calculation, in addition to the solution based on the equations (9) to (12), alternatively the equations (19) and (20) can be transposed according to $W(v)e^{i\phi_2(v)}$ and $F(v)e^{i\phi_2(v)}$ and the magnitude of said solutions can then be used. The latter approach proves to be less susceptible to noise in practice.

In one preferred variant of the method however the standard per image point $$\chi^2(W,F,\phi_2)=|\tilde{S}_1(v)-(W+c_1F)e^{i\phi_2}|^2+|\tilde{S}_2(v)-(W+c_2F)e^{i\phi_2}|^2 \qquad (21)$$

is calculated using a non-linear optimization method. This is a chi square method, for example the Marquardt-Levenberg method can be used for the purpose, in which W (i.e. the water image data) and F (i.e. the fat image data) and $\phi_2$ are optimized. It is recommended that the values $W(v)$ and $F(v)$ and the associated optimum $\phi_2$ are used as start values, as determined with the aid of the equations (19) and (20).

It is assumed in the following, without restricting the general nature of the invention, that the chemical substances are water and fat.

As shown in FIG. 1, the method generally starts with method step I with the transfer or measurement of echo data $RD_1$, $RD_2$ from a certain defined region, for which the image data is to be generated, the echo data $RD_2$, $RD_2$ being recorded with arbitrary different echo times. As the echo times can be selected arbitrarily, an arbitrary magnetic resonance sequence can also be used, for example a spin-echo sequence, turbo-spin-echo sequence, gradient echo sequence, etc.

In a step II complex image data is first generated for the defined region on the basis of the first and second MR echo data. This image data $S_1$, $S_2$ is then used at different points within the method.

For example this image data $S_1$, $S_2$ is used to determine the desired phase difference map $\Delta\Phi$, an image point by image point progressive growth method being used according to the invention. Also beforehand or parallel thereto in a step VII the linear portion of the spatial variation of the phase difference can be determined, this data then being used for correction within the method for determining the phase difference map. This image data $S_1$, $S_2$ can also be used in a step XI to calculate candidate water image data $W_{K1}(v)$, $W_{K2}(v)$ and candidate fat image data $F_{K1}(v)$, $F_{K2}(v)$. The desired fat and water image data W, F can also be generated later in step X based on the complex image data $S_1$, $S_2$ ultimately taking into account the phase difference map $\Delta\Phi$.

The method step III, in which the phase difference map $\Delta\Phi$ is determined, starts first with a method step IV, in which the possible solutions of the equations (16) and (17), i.e. the candidate phase difference values $\Delta\Phi_{K1}(v)$, $\Delta\Phi_{K2}(v)$ for each image point, are calculated. As described above, maximum two solutions for $W(v)$, $F(v)$ and corresponding candidate phase difference values $\Delta\Phi_{K1}(v)$, $\Delta\Phi_{K2}(v)$ can be calculated from the magnitude of the signals $S_1(v)$ and $S_2(v)$. The problem then is the selection of the correct solutions. The following method is based on the fact that the variation in the phase difference varies to a small degree spatially.

Although this is not necessarily essential beforehand, it is recommended for numerical efficiency first to determine two complete images or maps containing the possible candidate phase difference values $\Delta\Phi_{K1}(v)$, $\Delta\Phi_{K2}(v)$ for each location v (i.e. image point with the coordinates v, in the following therefore image point and location are used synonymously and are provided with the reference character v). Parallel thereto in step XI the candidate images $W_{K1}(v)$, $W_{K2}(v)$, $F_{K1}(v)$, $F_{K2}(v)$ respectively can be determined for the fat and water image. As also mentioned above, there may be just one or no exact solution as a function of the magnitude of the quotients of the signals $S_1(v)/S_2(v)$. If there is just one solution, there is no problem, as this solution is unique. Nevertheless it can be used first in the further method as the "candidate phase difference value". If there is no solution, an approximation can be stored, as mentioned above. It is additionally stored here for each location v whether the solution is an approximation or an exact solution.

Also in step IV weighting coefficients g(v) can be determined and stored respectively for each image point or location v, for example according to the above equation (18). They can then be used later to determine a measure of quality within the growth method.

In a following step V a linear phase correction is first performed for each of the candidate phase difference values to stabilize the algorithm in the growth method, which follows in step VI. The linear portions $\Delta\Phi_L$ of the spatial variation of the phase difference estimated beforehand in step VII are used for this purpose.

This method step VII can be divided roughly into two method steps VIII and IX. To determine the linear portion of the phase, a mean correlation $\text{Corr}(\Delta x)$ of adjacent pixels is first considered in each spatial direction x, y, z over the relevant image region in step VIII. This can take place using the equation $$\text{Corr}(\Delta x) = \sum_{\{x|x\in FOV \cap (x+\Delta x)\in FOV\}} f(x) \cdot S_2(x+\Delta x) \cdot S_1(x+\Delta x)^* \cdot S_1(x) \cdot S_2(x)^*. \quad (22)$$

FOV here is the "Field of View", i.e. the relevant visual region. Equation (22) only describes the situation in the x direction. These equations are also executed in the y and z directions. The upper index * again denotes the conjugated value of the respective image point. $\Delta x$ here is an arbitrary distance between two considered image points, for example $\Delta x=1$. In equation (22) f(x) is a real weighting coefficient, which allows various optimizations:

1. Firstly it can mask the field of view FOV, e.g. by masking out image points at the edge or image points not located in the object of interest (or region of interest ROI). For this purpose the function f(x) can be set to zero at these points.

2. Secondly the weighting of the sum can be based on the strength of the signal at the respective image point, e.g. by the selection $$f(x) = \frac{1}{|S_2(x+\Delta x) \cdot S_1(x)^*|} \quad (23)$$

This partially compensates for the signal strength being included four-fold in equation (22). In other words the selection of such a weighting factor ensures that the value of the signal is only squared in the equation (22).

3. Thirdly masking can also take the form that the sum is restricted to terms in the area of which the summand or just its phase varies as little as possible. In practice it has been shown expedient to restrict to an area along the considered direction of $\Delta x$. This excludes in particular the change from a water-dominated to a fat-dominated region, in order to avoid resulting distortions.

Naturally f(x) can also be set so that marking and weighting are undertaken at the same time, in other words at the points where the image points are not considered f(x)=0 is set and for example at all other points according to the equation (23).

The idea behind considering the correlation is based on the fact that each phase difference (in any spatial direction x) can be written as follows:

$$\Phi_2(x)-\Phi_2(x)=\text{const.}+m_\Phi \cdot x \quad (24)$$

Here the rear summand $m\Phi \cdot x$ is a linear portion, which can be closely approximated. Knowledge of this linear portion not only improves the stability of the growth method, it also permits a correction of unwanted measuring effects such as eddy currents and temporal gradient delays.

The selection of f(x) described above in 3. such that the sum is restricted to terms in the area of which the summand or phase only varies as little as possible, serves for the summation in equation (22) to restrict itself to those image points v, in which $$F(v)\approx F(v+\Delta x) \text{ and } W(v)\approx W(v+\Delta x) \quad (25)$$

applies, i.e. in which the variation of the water and fat image is small with a displacement of $\Delta x$ image points in the x direction. Even if the values are not known exactly, this assumption proves expedient in the practical estimation. With this assumption and with an exactly linear phase difference, the following results from equation (22)

$$\text{Corr}(\Delta x) = \sum_{\{x|x\in FOV \cap (x+\Delta x)\in FOV\}} f(x) \cdot S_2 \quad (26)$$
$$|W(v)+c_2 F(v)|^2 \cdot |W(v)+c_1 F(v)|^2 \cdot e^{im\Phi \cdot \Delta x}$$

As the front factors in this equation are real, the following applies $$\text{Corr}(\Delta x) \propto (e^{im\Phi \cdot \Delta x} \quad (27)$$

This shows that the linear portion of the phase $m\Phi$ can be calculated in the direction of $\Delta x$ from the complex phase of $\text{Corr}(\Delta x)$.

As mentioned above, in practice such a correlation is expediently performed in each spatial direction x, y, z, it therefore only being possible preferably to select adjacent pixels in each direction $\Delta x=\Delta y=\Delta z=1$. It is therefore only necessary to calculate the value $\text{Corr}(\Delta x)$ according to equation (22) in order to calculate the linear portion of the phase displacement for each image point. Ultimately the value $\text{Corr}(\Delta x)$ therefore contains the increase $m_\Phi$ in the x direction, in other words it is only necessary to multiply this increase by the coordinate value of an image point at the location v in the x direction to obtain the linear portion. This can be performed in all three spatial directions. This linear portion $\Delta \Phi_L$, can then simply be deducted from the candidate phase difference values in step V. In practice this can also be done by multiplying the exponential functions $e^{i(\Phi_2(v)-\Phi_1(v))}$ of the two candidate phase difference values according to the equations (16) and (17) by the value for $e^{-im_\Phi \cdot x}$ determined by way of $\text{Corr}(\Delta x)$.

The result after step V is then candidate phase difference values $\Delta \Phi'_{K1}(v), \Delta \Phi'_{K2}(v)$, corrected in respect of the linear portion of the spatial variation of the phase difference.

These values are used in step VI for the image point by image point progressive growth method. See FIG. 2 for details of step IV.

The method first starts in step VI.1 with the selection of a seed image point. The image point used here is preferably one that is relatively bright in the image data $S_1(v)$, $S_2(v)$, in other words has a high intensity. This has the advantage that the candidate phase difference value that causes the relevant image point to be identified as fat can be used with a relatively high level of certainty for this image point, as fat emits much more brightly than water. If all the candidate phase difference values have been calculated first beforehand for all the image points, as shown in the present example embodiment, an image point can be selected for which a unique solution has been identified. However in principle this is not necessary. One of the candidate phase difference values is then assumed to be the correct phase difference value for this seed image point vs; if a particularly bright pixel is selected, as described above, the candidate phase difference value that causes this image point to be identified as fat. This selected phase difference value $\Delta \Phi(vS)$ of the seed image point vS is then recorded as a first phase difference value $\Delta \Phi(vS)$ in the desired phase difference map $\Delta \Phi$.

All the adjacent image points of the seed image point vS are then checked first starting with this seed image point vS. The vicinity can be selected arbitrarily. It has been demonstrated in practice that it is sufficient with three-dimensional image data simply to check just the 6 directly adjacent neighbors, in other words not the diagonal neighbors. This has the advantage that it entails a smaller computation outlay. All the adjacent image points are then evaluated according to certain rules. The following criteria can be used for this evaluation:

a) A search is carried out first in the respective image point for the candidate phase difference value that is closer to the already determined phase difference value of the previous start point, i.e. the image point whose neighbor is the image point that has just been checked.

b) A quality value is then determined according to certain quality criteria as to how good this decision was. There are preferably three possible criteria for this.

i) The first criterion checks how big the phase jump was, in other words how far the selected candidate phase difference value is from the phase difference value of the start point.

ii) A further criterion is the intensity of the point in relation to the image values $S_1$, $S_2$. To this end the above-mentioned weighting coefficient g(v) according to equation (18) is preferably used as a quality value, the quality getting better the greater the value g(v).

iii) It is also checked whether the selected phase difference value is actually a selection of two candidate phase difference values, whether it is a unique solution or an approximated solution. If it is a unique solution, the quality is very good; if it is one of two candidate phase difference values, quite a high quality can similarly be assumed. If it is an approximated solution, the quality should be judged to be low.

By combining the different quality criteria i) to iii) it is possible to assign a quality value to the respective image point. For example a digital quality value between for example 1 and 27 can be allocated, where 1 is a very good quality and 27 is a poor quality. In this process every checked image point can be assigned for example to one of for example 27 quality stacks. Alternatively of course real quality values can be calculated and the individual image points in a list can then be categorized according to their real value.

To improve the evaluation method further, instead of calculating the difference between the candidate phase difference value and the selected difference value of the previous adjacent image point, i.e. the start point for the respective check, a difference in relation to a mean phase difference value in the vicinity of the initial image point or the considered image point can optionally be taken into account. For example a box of any size, for example 5×5×5 image points, can be selected around the initial image point or the image point to be checked. Then all the image points within the box, for which the phase difference value has already been definitively determined, are used to select a common mean phase difference value for this local area as a local reference phase difference value. This has the advantage that, in particular in conjunction with the prioritization described below for determining the phase difference values, the image points for which the phase difference values can be determined with the greatest certainty, in other words with the highest quality, have the greatest influence.

Figure 3:
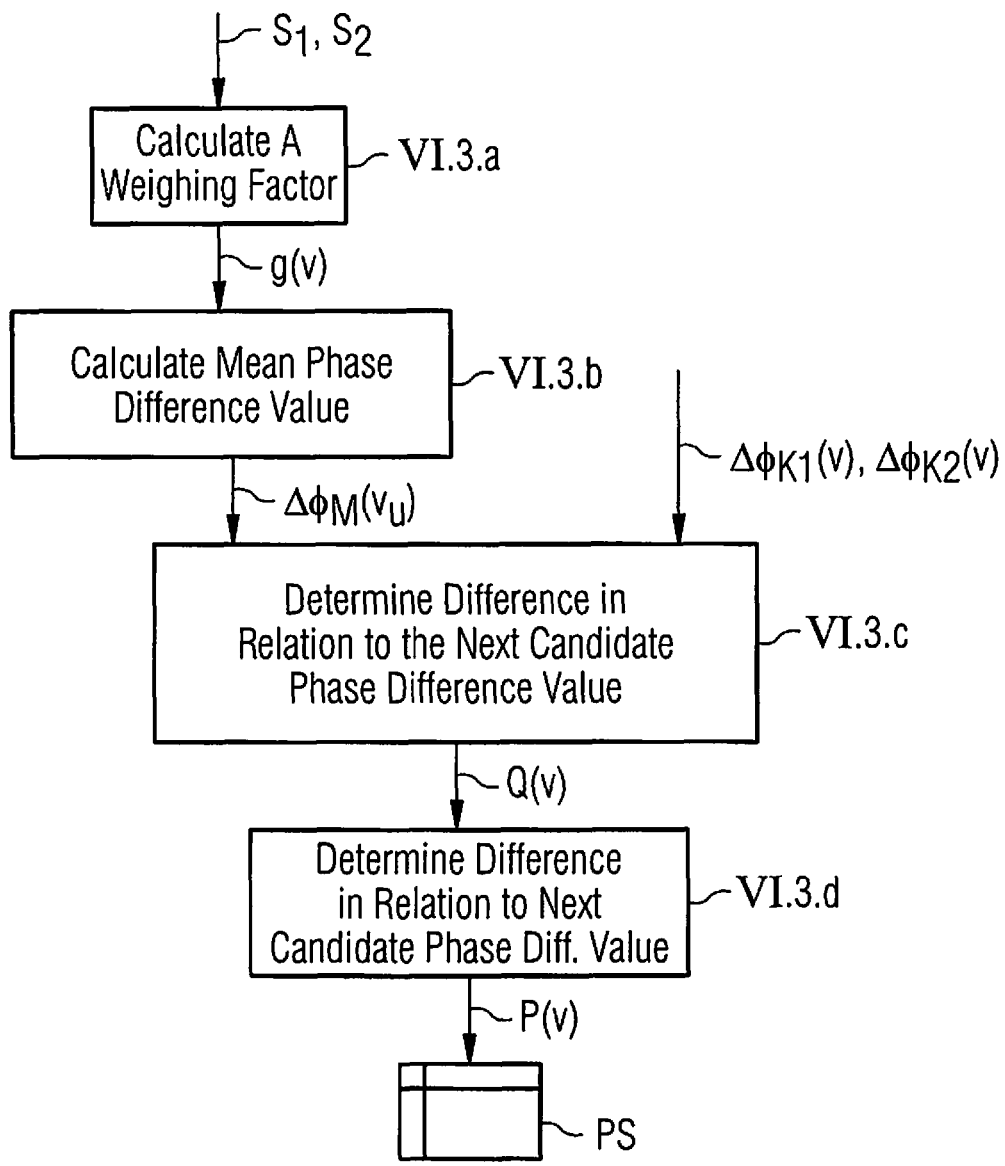
FIG. 3 shows a flow diagram of a possible sequence of a method within method steps VI.2 or VI.5 in the method according to FIG. 3.

This prioritization is clarified once again in FIG. 3. As can be seen here, for a point v, which is about to be checked, a weighting factor g(v) is calculated (e.g. using equation (18)) for each adjacent point from the image data S1, S2 in each instance. This takes place in method step VI.3.a.

Also in method step VI.3.b the mean phase difference value $\Delta \Phi_M(v_U)$ of all the image points $v_U$ in the area around the adjacent image point v is calculated.

In step VI.3.c this mean phase difference value $\Delta \Phi_M(v_U)$ is then used to determine the difference in relation to the next candidate phase difference value $\Delta \Phi_{K1}(v)$, $\Delta \Phi_{K1}(v)$ at the adjacent image point considered in each instance and then to determine an overall quality value Q(v) for this adjacent image point, which includes all the quality criteria i) to iii) as described above.

In step VI.3.d this value is then converted to a priority evaluation and a priority value P(v) is assigned accordingly to this considered adjacent point, on the basis of which organization into a priority stack PS then takes place.

Figure 2:
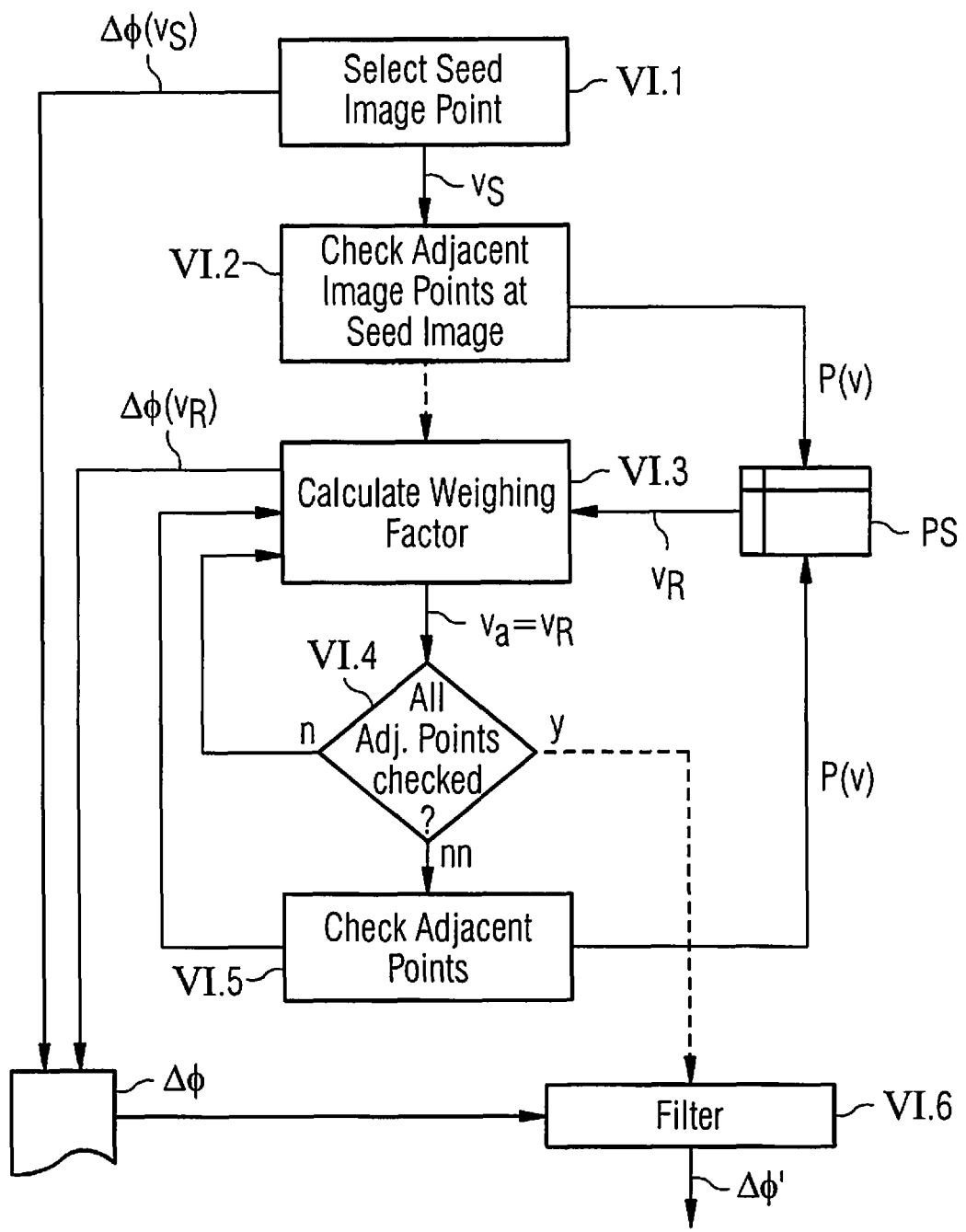
FIG. 2 shows a flow diagram of a possible sequence of a method within method step VI in the method according to FIG. 2.

This is also illustrated in FIG. 2 as the output of method step VI.2. Step VI.2 is then terminated, when all six adjacent points of the seed image point vS have been checked and prioritized. Then in step VI.3 the one of the checked six adjacent points of the seed image point vS with the highest quality is selected, for example an adjacent image point, which was sorted on the lowest priority stack or is first in the priority list. It is then decided for this currently highest ranking image point vR which of the candidate phase difference values applies, if there are two candidate phase difference values. If there is only one candidate phase difference value, it is an image point that has been categorized with high priority anyway. As it is a unique solution, this one phase difference value is of course adopted and no further selection has to be made in this step. The selected phase difference value $\Delta\Phi(v_R)$ is then added to the phase difference map $\Delta\Phi$.

In an interrogation step IV.4 it is first asked whether a check and prioritization have already been performed for all the adjacent points or even whether in some instances the phase difference values have already been determined exactly for all the image points. If not all the adjacent points have been checked (branch "nn" of the interrogation step IV.4), the adjacent points are checked in step VI.5. In this process a check is performed for all the adjacent image points of the currently selected image point vR (for which the phase difference value has been determined just beforehand and which is the new initial image point va for the next step instead of the seed image point vS), for which the phase difference value has not yet been determined. If it is the second step for example, in other words the first image point outside the seed image point is examined, this means that only five neighbors still have to be checked here because logically one neighbor is the seed image point vS, for which the phase difference value $\Delta\Phi(v_S)$ has already been determined in step VI.1. The neighbors are checked in step VI.4 in the same manner as the adjacent image points of the seed image point vS are checked in step VI.2. Here too, as illustrated in FIG. 3, priority values P(v) are determined for each adjacent image point and then the image points v are added to the priority list PS accordingly.

If in step VI.5 all the neighbors of the initial image point $v_a$ have been checked and prioritized, step VI.3 continues again with a new current image point $v_R$, which currently has the highest ranking within the priority list PS.

If it is actually the case that all the image points have already been checked, in other words all the image points have already been ranked in the priority list PS, but the phase difference values have not yet been determined for all the image points, the method continues immediately in step VI.3 (branch "n" of the interrogation step IV.4), to take the image point with the next highest ranking from the priority list PS and then determine the phase difference value for it.

If it is ultimately determined in step VI.4 (branch "y") that the phase difference values have already been determined for all the image points, the growth method is terminated, as a complete phase difference map $\Delta\Phi$ is present. In a closing step VI.6 this phase difference map $\Delta\Phi$ can be filtered once again, for example using a low-pass filter, by averaging the phase difference values $\Delta\Phi(v)$ over an arbitrary box in an area around an image point v in each instance. This gives a smoother phase difference map $\Delta\Phi'$.

As shown in FIG. 1, this phase difference map $\Delta\Phi$ or $\Delta\Phi'$ can then be used together with the already reconstructed first and second image data $S_1(v)$, $S_2(v)$ to calculate the desired separate fat and water images F(v) and W(v) (step X). This can be done for example with the aid of the method described above with reference to the equations (20) and (21), it being possible for the candidate image data $W_{K1}(v)$, $W_{K2}(v)$, $F_{K1}(v)$, $F_{K2}(v)$ determined in step XI to be used as the start values.

An embodiment of the inventive method has proved to be extremely robust and is also able to generate excellent water and fat image data when echo times are selected so that a unique solution cannot be determined for any of the image points.

Figure 4:
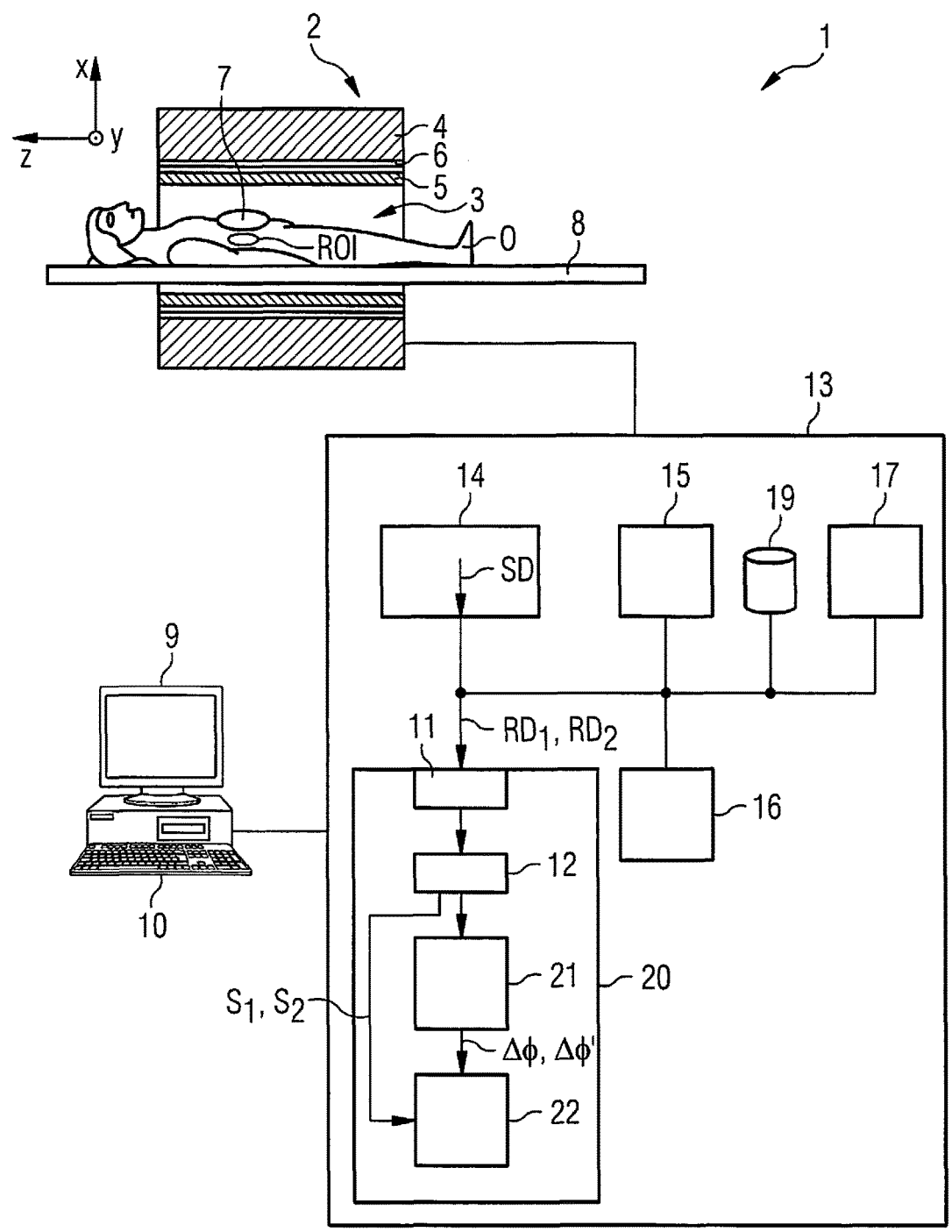
FIG. 4 shows a schematic diagram of a magnetic resonance unit according to an example embodiment of the invention.

FIG. 4 finally shows a roughly schematic diagram of an inventive magnetic resonance unit 1 (hereafter referred to as "MR unit" for short), which can be used to perform the inventive method. It comprises the actual magnetic resonance scanner 2 with an examination space 3 or patient tunnel extending in the z direction, into which a patient or proband or other examination object, in whose body the region of interest ROI, for example a specific organ, is located, can be introduced on a couch 8.

The magnetic resonance scanner 2 is equipped in the standard manner with a basic field magnet system 4, a gradient system 6 and an HF transmit antenna system 5 and an HF receive antenna system 7. In the illustrated exemplary embodiment the HF transmit antenna system 5 is a whole body coil incorporated in a fixed manner in the magnetic resonance scanner 2, while the HF receive antenna system 7 consists of local coils to be disposed on the patient or proband (symbolized in FIG. 1 by just one local coil). In principle however the whole body coil can also be used as the HF receive antenna system and the local coils can be used as the HF transmit antenna system, if said coils can be switched to different operating modes in each instance.

The MR unit 1 also has a central control facility 13, which is used to control the MR unit 1. This central control facility 13 comprises a sequence control unit 14 for pulse sequence control. This is used to control the sequence of high-frequency pulses (HF pulses) and gradient pulses as a function of a selected imaging sequence. Such an imaging sequence can be predefined for example within a measuring or control protocol, which is stored for example in a storage unit 19 and can be selected and modified, if necessary, by an operator. In the present instance the sequence control unit 14 is configured such that any echo pulse sequence can be performed to acquire the first and second echo data $RD_1$, $RD_2$.

To output the individual HF pulses the central control facility 13 has a high-frequency transmit facility 15, which generates and amplifies the HF pulses and feeds them by way of a suitable interface (not shown in detail) into the HF transmit antenna system 5. To control the gradient coils of the gradient system 6 the control facility 13 has a gradient system interface 16. The sequence control unit 14 communicates appropriately, e.g. by emitting sequence control data SD, with the high-frequency transmit facility 15 and the gradient system interface 16 to emit the echo pulse sequence. The control facility 13 also has a high-frequency receive facility 17 (which also communicates appropriately with the sequence control unit 14) in order to acquire magnetic resonance signals received in a coordinated manner from the HF transmit antenna system 7, in other words the echo data $RD_1$, $RD_2$.

In the present instance the central control facility 13 has an inventive image processing facility 20, which can be implemented for example in the form of software on a computer unit of the central control facility 13, for example a microcontroller or the like. This image processing facility 20 receives the acquired echo data $RD_1$, $RD_2$ by way of an interface 11. A standard image reconstruction unit 12 then uses this echo data $RD_1$, $RD_2$ in the conventional manner to reconstruct the first and second image data $S_1$, $S_2$ of the defined region ROI, from which the echo data $RD_1$, $RD_2$ was captured. This first and second image data $S_1$, $S_2$ is then transferred to a phase difference determination unit 21, which operates in the manner described above, to create the phase difference map ΔΦ. The first and second image data S₁, S₂ and the phase difference map ΔΦ can ultimately also be transferred to an image determination unit 22, which can determine the separate image data W and F for the two chemical substance types, in other word for example water and fat, in the defined region of interest ROI on the basis of the phase difference map ΔΦ and on the basis of the first and second image data S₁, S₂, as described in method step X according to FIG. 1.

The central control facility 13 can be operated by way of a terminal with an input unit 10 and a display unit 9, by means of which therefore the entire MR unit 1 can be operated by an operator. MR images, in particular the separate fat and water image data, can also be displayed on the display unit 9 and the input unit 10 can be used, where necessary in combination with the display unit 9, to plan and start measurements.

It should finally be noted again that the method and structures described above in detail are only exemplary embodiments and the basic principle can also be varied by the person skilled in the art in other areas without departing from the scope of the invention, in so far as it is predefined by the claims. The inventive MR unit 1 and in particular the control facility 13 can therefore also have a plurality of further components (not shown in detail but conventionally present on such devices), for example a network interface to connect the unit as a whole to a network and to be able to exchange raw data and/or image data or parameter maps or even further data, for example patient-related data or control protocols, and store it on external storage units for archiving and optionally subsequent outputting. It should also be noted for the sake of completeness that the use of the indefinite article "a" or "an" does not exclude the possibility of the relevant features also being present in a multiple manner. Similarly the term "unit" or "module" does not exclude the possibility of these consisting of a number of components, which can in some instances also be spatially distributed.

What is claimed is:

1. A method for creating a phase difference map for generating image data of two different chemical substance types in a defined region of an examination object by way of magnetic resonance imaging measurement, the method comprising:
   respectively capturing first and second magnetic resonance raw echo data of the defined region at two different respective echo times;
   reconstructing first and second image data of the defined region on the basis of the first and second magnetic resonance raw echo data;
   determining candidate phase difference values on the basis of the first and second image data for image points of the defined region using a signal model of at least one of the two chemical substance types, the signal model containing a settable echo time parameter;
   determining a linear portion of a spatial variation of the candidate phase difference values of image points for at least one subregion of the defined region;
   performing a correction of the candidate phase difference values based on the linear portions; and
   creating a phase difference map, with a phase difference value first being determined for a seed image point and then a phase difference value being selected, in each instance, from the corrected phase difference values of the respective image point starting from the seed image point in an image point by image point progressive growth method for further individual image points.

2. The method of claim 1, wherein the determining the linear portion of the spatial variation of the candidate phase difference values includes determining a correlation of the first and second image data of adjacent image points within the subregion.

3. A non-transitory computer-readable medium comprising computer-readable instructions, which when executed by a processor, causes the processor to execute the method of claim 2.

4. The method of claim 2, wherein the determining the correlation is based on a weighting coefficient that is a function of the image point.

5. The method of claim 4, wherein the weighting coefficient is a function of an intensity level of at least one of the first and second image data at least one of at the respective image point and of the position of the respective image point.

6. The method of claim 1, further comprising:
   determining a quality value according to quality criteria within the growth method, in each instance, for respective adjacent image points of an initial image point, for which a phase difference value has already been determined.

7. The method of claim 6, further comprising:
   prioritizing an image point based on a correspondingly determined quality value to determine a phase difference value.

8. The method of claim 7, wherein at least one of
   the quality criteria comprise an evaluation of intensity values of the image point in the first and second image data, and
   whether a unique phase difference value has been determined is taken into account, according to the quality criteria, on the basis of the first and second image data for the relevant image point.

9. The method of claim 6, wherein at least one of,
   the quality criteria include an evaluation of intensity values of the image point in the first and second image data and
   whether a unique phase difference value has been determined is taken into account, according to the quality criteria, on the basis of the first and second image data for the relevant image point.

10. The method of claim 6, wherein the quality criteria include an evaluation of a deviation of at least one of the candidate phase difference values of the image point to a local reference phase difference value.

11. The method of claim 10, wherein the local reference phase difference value comprises a mean phase difference value of the phase difference values of image points of a local area of the image point to be evaluated in each instance, for which a phase difference value has already been determined.

12. The method of claim 11, wherein the respective phase difference values of the image points are weighted with a weighting factor for determining the mean phase difference value, in each instance, the weighting factor being a function of intensity values of the image points in the first and second image data.

13. The method of claim 6, wherein a respective phase difference value is determined for a new image point, in each instance, when a quality value has been determined for all the image points in a defined vicinity of a previous image point.

14. The method of claim 1, wherein candidate image data of the chemical substance types is also determined using a spectral signal model in addition to the candidate phase difference values.

15. A method for determining image data for two different chemical substance types in a defined region of an examination object, the method comprising:
   determining a phase difference map for the defined region using the method of claim 1; and
   determining the image data for the chemical substance types on the basis of the first and second image data of the defined region and on the basis of the determined phase difference map.

16. The method of claim 15, wherein the image data for the chemical substance types is determined via an optimization method.

17. A non-transitory computer-readable medium comprising computer-readable instructions, which when executed by a processor, causes the processor to execute the method of claim 1.

18. The method of claim 1, wherein the image data for the chemical substance types is determined via an optimization method.

19. An image processing facility for determining a phase difference map, the image processing facility comprising:
   an interface, configured to respectively capture first and second magnetic resonance raw echo data of the defined region, the first and second magnetic resonance raw echo data being determined at two respectively different echo times;
   an image data reconstruction unit, configured to reconstruct first and second image data of the defined region on the basis of the respective first and second magnetic resonance raw echo data; and
   a phase difference determination unit, configured to
      determine candidate phase difference value on the basis of the first and second image data for image points of the defined region using a signal model of at least one of the two chemical substance types containing a settable echo time parameter,
      determine a linear portion of a spatial variation of the candidate phase difference values of image points for at least one subregion of the defined region,
      perform a correction of the candidate phase difference values based on the linear portion, and
      create a phase difference map, with a phase difference value first being determined for a seed image point and then a phase difference value being selected, in each instance, from the corrected phase difference values of the respective image point starting from the seed image point in an image point by image point progressive growth method for further individual image points.

20. A magnetic resonance unit comprising; the image processing facility of claim 19.

21. The image processing facility of claim 19, further comprising:
   an image determination unit, configured to determine image data for the chemical substance types on the basis of the phase difference map and on the basis of the first and second image data of the defined region.

22. A magnetic resonance unit comprising;
the image processing facility of claim 21.

* * * * *